United States Patent
Yu et al.

(10) Patent No.: US 7,894,248 B2
(45) Date of Patent: Feb. 22, 2011

(54) PROGRAMMABLE AND REDUNDANT CIRCUITRY BASED ON MAGNETIC TUNNEL JUNCTION (MTJ)

(75) Inventors: David Chang-Cheng Yu, Pleasanton, CA (US); Xiao Luo, Cupertino, CA (US); Jia-Hwang Chang, Saratoga, CA (US)

(73) Assignee: Grandis Inc., Milpitas, CA (US)

( * ) Notice: Subject to any disclaimer, the term of this patent is extended or adjusted under 35 U.S.C. 154(b) by 50 days.

(21) Appl. No.: 12/210,126

(22) Filed: Sep. 12, 2008

(65) Prior Publication Data

US 2010/0067293 A1  Mar. 18, 2010

(51) Int. Cl.
G11C 11/00 (2006.01)
G11C 17/00 (2006.01)
G11C 17/02 (2006.01)
G11C 11/14 (2006.01)
G11C 17/18 (2006.01)

(52) U.S. Cl. ............ 365/158; 365/96; 365/97; 365/171; 365/225.7

(58) Field of Classification Search ............ 365/158
See application file for complete search history.

(56) References Cited

U.S. PATENT DOCUMENTS

| | | | |
|---|---|---|---|
| 5,347,485 A | 9/1994 | Taguchi et al. |
| 5,432,734 A | 7/1995 | Kawano et al. |
| 5,448,515 A | 9/1995 | Fukami et al. |
| 5,695,864 A | 12/1997 | Slonczewski |
| 5,949,622 A | 9/1999 | Kamiguchi et al. |
| 6,005,800 A | 12/1999 | Koch et al. |
| 6,100,188 A | 8/2000 | Lu et al. |
| 6,124,711 A | 9/2000 | Tanaka et al. |
| 6,137,662 A | 10/2000 | Huai et al. |
| 6,146,775 A | 11/2000 | Fujita et al. |
| 6,172,904 B1 | 1/2001 | Anthony et al. |
| 6,175,476 B1 | 1/2001 | Huai et al. |
| 6,185,079 B1 | 2/2001 | Gill |
| 6,196,465 B1 | 3/2001 | Awano |
| 6,198,610 B1 | 3/2001 | Kawawake et al. |
| 6,201,763 B1 | 3/2001 | Bourgeois et al. |
| 6,205,052 B1 | 3/2001 | Slaughter et al. |
| 6,211,090 B1 | 4/2001 | Durlam et al. |

(Continued)

FOREIGN PATENT DOCUMENTS

EP  0 843 368  5/1998

(Continued)

OTHER PUBLICATIONS

Albert, et al., "Spin-polarized current switching of a Co thin film nanomagnet", *Applied Physics Letters*, vol. 77, No. 23, pp. 3809-3811, Dec. 4, 2000.

(Continued)

*Primary Examiner*—Son L Mai
(74) *Attorney, Agent, or Firm*—Fish & Richardson P.C.

(57) ABSTRACT

Techniques, apparatus and circuits based on magnetic or magnetoresistive tunnel junctions (MTJs). In one aspect, a programmable circuit device can include a magnetic tunnel junction (MTJ); a MTJ control circuit coupled to the MTJ to control the MTJ to cause a breakdown in the MTJ in programming the MTJ; and a sensing circuit coupled to the MTJ to sense a voltage under a breakdown condition of the MTJ.

16 Claims, 4 Drawing Sheets

U.S. PATENT DOCUMENTS

| | | | |
|---|---|---|---|
| 6,222,707 B1 | 4/2001 | Huai et al. | |
| 6,266,218 B1 | 7/2001 | Carey et al. | |
| 6,324,093 B1 * | 11/2001 | Perner et al. | 365/171 |
| 6,347,049 B1 | 2/2002 | Childress et al. | |
| 6,351,355 B1 | 2/2002 | Min et al. | |
| 6,351,409 B1 | 2/2002 | Rizzo et al. | |
| 6,381,105 B1 | 4/2002 | Huai et al. | |
| 6,430,085 B1 | 8/2002 | Rizzo | |
| 6,438,026 B2 | 8/2002 | Gillies et al. | |
| 6,447,935 B1 | 9/2002 | Zhang et al. | |
| 6,469,926 B1 | 10/2002 | Chen | |
| 6,473,337 B1 * | 10/2002 | Tran et al. | 365/173 |
| 6,518,071 B1 | 2/2003 | Durlam et al. | |
| 6,538,859 B1 | 3/2003 | Gill | |
| 6,545,906 B1 | 4/2003 | Savtchenko et al. | |
| 6,603,677 B2 | 8/2003 | Redon et al. | |
| 6,633,498 B1 | 10/2003 | Engel et al. | |
| 6,649,960 B1 | 11/2003 | Cross | |
| 6,687,098 B1 | 2/2004 | Huai | |
| 6,714,444 B2 | 3/2004 | Huai et al. | |
| 6,717,194 B2 | 4/2004 | Liu et al. | |
| 6,751,149 B2 * | 6/2004 | Seyyedy et al. | 365/225.7 |
| 6,765,819 B1 | 7/2004 | Bhattacharyya et al. | |
| 6,768,150 B1 | 7/2004 | Low et al. | |
| 6,771,534 B2 | 8/2004 | Stipe | |
| 6,791,868 B2 | 9/2004 | Gider et al. | |
| 6,801,414 B2 | 10/2004 | Amano et al. | |
| 6,801,471 B2 | 10/2004 | Viehmann et al. | |
| 6,829,161 B2 | 12/2004 | Huai et al. | |
| 6,838,740 B2 | 1/2005 | Huai et al. | |
| 6,847,547 B2 | 1/2005 | Albert et al. | |
| 6,888,704 B1 | 5/2005 | Diao et al. | |
| 6,888,742 B1 | 5/2005 | Nguyen et al. | |
| 6,893,741 B2 | 5/2005 | Doerner et al. | |
| 6,920,063 B2 | 7/2005 | Huai et al. | |
| 6,927,468 B2 | 8/2005 | Yoda et al. | |
| 6,933,155 B2 | 8/2005 | Albert et al. | |
| 6,950,335 B2 | 9/2005 | Dieny et al. | |
| 6,958,927 B1 | 10/2005 | Nguyen et al. | |
| 6,967,863 B2 | 11/2005 | Huai | |
| 6,979,586 B2 | 12/2005 | Guo et al. | |
| 6,985,383 B2 * | 1/2006 | Tang et al. | 365/171 |
| 6,985,385 B2 | 1/2006 | Nguyen et al. | |
| 6,989,972 B1 | 1/2006 | Stoev et al. | |
| 6,992,359 B2 | 1/2006 | Nguyen et al. | |
| 7,006,375 B2 | 2/2006 | Covington | |
| 7,009,877 B1 | 3/2006 | Huai et al. | |
| 7,027,268 B1 | 4/2006 | Zhu et al. | |
| 7,057,921 B2 | 6/2006 | Valet | |
| 7,088,609 B2 | 8/2006 | Valet | |
| 7,098,494 B2 | 8/2006 | Pakala et al. | |
| 7,105,372 B2 | 9/2006 | Min et al. | |
| 7,106,559 B2 | 9/2006 | Hasegawa et al. | |
| 7,106,624 B2 | 9/2006 | Huai et al. | |
| 7,110,287 B2 | 9/2006 | Huai et al. | |
| 7,126,201 B2 | 10/2006 | Matsutera et al. | |
| 7,176,065 B2 | 2/2007 | Seyyedy et al. | |
| 7,187,577 B1 | 3/2007 | Wang et al. | |
| 7,190,558 B2 | 3/2007 | Iwasaki et al. | |
| 7,224,601 B2 | 5/2007 | Panchula et al. | |
| 7,224,630 B2 * | 5/2007 | Andre et al. | 365/210.1 |
| 7,254,058 B2 * | 8/2007 | Hidaka | 365/171 |
| 7,262,064 B2 | 8/2007 | Ohba et al. | |
| 7,272,034 B1 | 9/2007 | Chen et al. | |
| 7,272,035 B1 | 9/2007 | Chen et al. | |
| 7,286,395 B2 | 10/2007 | Chen et al. | |
| 7,289,356 B2 | 10/2007 | Diao et al. | |
| 7,307,302 B2 | 12/2007 | Saito | |
| 7,345,912 B2 | 3/2008 | Luo et al. | |
| 7,376,003 B2 * | 5/2008 | Iwata et al. | 365/158 |
| 7,379,327 B2 | 5/2008 | Chen et al. | |
| 7,430,135 B2 | 9/2008 | Huai et al. | |
| 7,570,463 B2 | 8/2009 | Parkin | |
| 7,576,956 B2 | 8/2009 | Huai | |
| 2002/0015823 A1 | 2/2002 | Mauler et al. | |
| 2002/0037595 A1 | 3/2002 | Hosotani | |
| 2002/0097534 A1 | 7/2002 | Sun et al. | |
| 2002/0105827 A1 | 8/2002 | Redon et al. | |
| 2002/0135955 A1 | 9/2002 | Ono et al. | |
| 2002/0154455 A1 | 10/2002 | Lenssen | |
| 2003/0184918 A1 | 10/2003 | Lin et al. | |
| 2003/0222322 A1 | 12/2003 | Park | |
| 2003/0235016 A1 | 12/2003 | Gill | |
| 2003/0235070 A1 * | 12/2003 | Ooishi | 365/158 |
| 2004/0021189 A1 | 2/2004 | Yoda et al. | |
| 2004/0125649 A1 | 7/2004 | Durlam et al. | |
| 2004/0130936 A1 | 7/2004 | Nguyen et al. | |
| 2004/0136231 A1 | 7/2004 | Huai et al. | |
| 2004/0170055 A1 | 9/2004 | Albert et al. | |
| 2004/0235201 A1 | 11/2004 | Albert et al. | |
| 2004/0249428 A1 | 12/2004 | Wang et al. | |
| 2005/0018476 A1 | 1/2005 | Kamijima et al. | |
| 2005/0041342 A1 | 2/2005 | Huai et al. | |
| 2005/0041456 A1 | 2/2005 | Saito | |
| 2005/0063222 A1 | 3/2005 | Huai et al. | |
| 2005/0093092 A1 | 5/2005 | Tran et al. | |
| 2005/0106810 A1 | 5/2005 | Pakala et al. | |
| 2005/0110004 A1 | 5/2005 | Parkin et al. | |
| 2005/0136600 A1 | 6/2005 | Huai | |
| 2005/0174821 A1 | 8/2005 | Zheng et al. | |
| 2005/0184839 A1 | 8/2005 | Nguyen et al. | |
| 2005/0201022 A1 | 9/2005 | Horng et al. | |
| 2005/0207263 A1 | 9/2005 | Okayama et al. | |
| 2005/0237787 A1 | 10/2005 | Huai et al. | |
| 2005/0248888 A1 | 11/2005 | Dieny et al. | |
| 2005/0254286 A1 | 11/2005 | Valet | |
| 2005/0254287 A1 | 11/2005 | Valet | |
| 2006/0002184 A1 * | 1/2006 | Hong et al. | 365/171 |
| 2006/0018057 A1 | 1/2006 | Huai et al. | |
| 2006/0049472 A1 | 3/2006 | Diao et al. | |
| 2006/0081953 A1 | 4/2006 | Nguyen et al. | |
| 2006/0092689 A1 * | 5/2006 | Braun et al. | 365/158 |
| 2006/0102969 A1 | 5/2006 | Huai et al. | |
| 2006/0114618 A1 | 6/2006 | Hosomi et al. | |
| 2006/0128038 A1 | 6/2006 | Pakala et al. | |
| 2006/0141640 A1 | 6/2006 | Huai et al. | |
| 2006/0187591 A1 | 8/2006 | Gill et al. | |
| 2006/0192237 A1 | 8/2006 | Huai | |
| 2006/0221676 A1 | 10/2006 | Qian et al. | |
| 2006/0281258 A1 | 12/2006 | Dieny et al. | |
| 2007/0015294 A1 * | 1/2007 | Horng et al. | 438/3 |
| 2007/0047294 A1 | 3/2007 | Panchula | |
| 2007/0063236 A1 | 3/2007 | Huai et al. | |
| 2007/0063237 A1 | 3/2007 | Huai et al. | |
| 2007/0086121 A1 | 4/2007 | Nagase et al. | |
| 2007/0096229 A1 | 5/2007 | Yoshikawa et al. | |
| 2007/0121373 A1 | 5/2007 | Koga | |
| 2007/0171694 A1 | 7/2007 | Huai et al. | |
| 2007/0246787 A1 | 10/2007 | Wang et al. | |
| 2007/0279967 A1 | 12/2007 | Luo et al. | |
| 2008/0061388 A1 | 3/2008 | Diao et al. | |
| 2008/0205121 A1 | 8/2008 | Chen et al. | |
| 2008/0219043 A1 | 9/2008 | Yoon et al. | |
| 2008/0219044 A1 | 9/2008 | Yoon et al. | |
| 2008/0238475 A1 | 10/2008 | Chua-Eoan et al. | |
| 2008/0247222 A1 | 10/2008 | Jung et al. | |
| 2009/0040855 A1 | 2/2009 | Luo et al. | |
| 2009/0050991 A1 | 2/2009 | Nagai | |
| 2009/0103354 A1 | 4/2009 | Yoon et al. | |
| 2010/0072524 A1 | 3/2010 | Huai et al. | |

FOREIGN PATENT DOCUMENTS

| | | |
|---|---|---|
| JP | 2006-093432 | 4/2006 |

| | | |
|---|---|---|
| KR | 2001-75690 | 8/2001 |
| KR | 2002-19017 | 3/2002 |
| KR | 2005-13215 | 2/2005 |
| TW | 446942 | 7/2001 |
| TW | 498167 | 8/2002 |
| TW | 498327 | 8/2002 |
| WO | WO 04/000369 | 12/2003 |
| WO | WO 2004/008536 | 1/2004 |
| WO | WO 2005/059955 | 6/2005 |
| WO | WO 2007/035786 | 3/2007 |
| WO | WO 2007/075889 | 7/2007 |
| WO | WO 2007/117392 | 11/2007 |
| WO | WO 2009/003060 | 12/2008 |
| WO | WO 2009/026249 | 2/2009 |

OTHER PUBLICATIONS

Berger, "Emission of spin waves by a magnetic multilayer traversed by a current", *Physical Review B*, vol. 54, No. 13, pp. 9353-9358, Oct. 1, 1996.
Cowache et al., "Spin-valve structures with NiO pinning layers," IEEE Transactions on Magnetics, vol. 34, Iss. 4, part 1, pp. 843-845 (Jul. 1998).
Cowburn et al., "Lateral interface anisotropy in nanomagnets," Journal of Applied Physics, 87(9): 7067-7069 (May 1, 2000).
Devolder, T. et al., "Instability threshold versus switching threshold in spin-transfer-induced magnetization switching", Physical Review B71, 184401-1-184401-6 (2005).
Doi, et al., "Magnetism of $Coi_{1-x}Fe_x$-NOL in Specular Spin-Valves", *IEEE Transactions on Magnetics*, vol. 40, No. 4, pp. 2263-2265, Jul. 2004.
Dokupil et al., Magnetostriction in combination with GMR/TMR-structures [online] Jun. 2, 2005, [retrieved pn Sep. 5, 2007] <URL: http://www.science24.com/paper/3919 >abstract.
English language translation of Korean Office Action in Korean Application No. 10-2008-7009238, mailed Feb. 5, 2010, 8 pages.
Korean Office Action in Korean Application No. 10-2008-7009238, mailed Feb. 5, 2010, 6 pages.
USPTO Notice of Allowance in U.S. Appl. No. 11/232,356, mailed May 3, 2010, 16 pages.
USPTO Final Office Action in U.S. Appl. No. 11/232,356, mailed Nov. 30, 2009, 29 pages.
USPTO Non-Final Office Action in U.S. Appl. No. 12/210,126, mailed Mar. 1, 2010, 6 pages.
USPTO Non-Final Office Action in U.S. Appl. No. 11/520,858, mailed Dec. 1, 2009, 24 pages.
USPTO Non-Final Office Action in U.S. Appl. No. 11/271,208, mailed Oct. 6, 2006, 6 pages.
USPTO Non-Final Office Action in U.S. Appl. No. 11/318,337, mailed Nov. 16, 2007, 10 pages.
USPTO Final Office Action in U.S. Appl. No. 11/394,056, mailed Feb. 3, 2009, 8 pages.
USPTO Non-Final Office Action in U.S. Appl. No. 11/394,056, mailed May 1, 2008, 9 pages.
USPTO Non-Final Office Action in U.S. Appl. No. 11/394,056, mailed Sep. 30, 2009, 9 pages.
Non-Final Office Action in U.S. Appl. No. 11/190,255, mailed Aug. 1, 2008, 24 pages.
Korean Intellectual Property Office, Office Action in Korean Pat. App. No. KR 9-5-2009-035312920, mailed Aug. 25, 2009, 5 pages.
English language translation of Korean Intellectual Property Office, Office Action in Korean Pat. App. No. KR 9-5-2009-035312920, mailed Aug. 25, 2009, 6 pages.
International Search Report and Written Opinion dated Nov. 26, 2008 for Application No. PCT/US06/48793, 11 pages.
International Search Report and Written Opinion dated Aug. 20, 2008 for Application No. PCT/US07/08203, 12 pages.
International Search Report and Written Opinion dated Nov. 18, 2008 for Application No. PCT/US2008/068230, 9 pages.
International Search Report and Written Opinion dated Nov. 21, 2008 for PCT/US2008/073512, 11 pages.
USPTO Non-Final Office Action in U.S. Appl. No. 11/232,356, mailed Jan. 23, 2009, 42 pages.
USPTO Non-Final Office Action in U.S. Appl. No. 11/769,645, mailed Mar. 6, 2009, 11 pages.
Taiwanese Patent Office, Office Action dated Sep. 29, 2009 for Taiwanese Patent Application No. 95134547 (8 pages).
English language translation of Taiwanese Patent Office, Office Action dated Sep. 29, 2009 for Taiwanese Patent Application No. 95134547 (7 pages).
Supplementary European Search Report dated Oct. 8, 2009 for European Patent Application No. EP06814990.5 (9 pages).
Inomata et al., "Size-independent spin switching field using synthetic antiferromagnets," Applied Physics Letters 82(16): 2667-2669 (Apr. 21, 2003).
Leighton et al., "Coercivity Enhancement in Exchange Biased Systems Driven by Interfacial Magnetic Frustration," Physical Review Letters 84(15): 3466-3469 (Apr. 10, 2000).
Mancoff, F.B. et al., "Phase-locking in double-point-contact spin-transfer devices", Nature, vol. 437:393-395 (2005).
Queste, S. et al., "Microwave permeability study for antiferromagnet thickness dependence on exchange bias field in NiFe/IrMn layers," Journal of Magnetism and Magnetic Materials, vol. 288, pp. 60-65 (Mar. 1, 2005).
Sharrock, M.P. et al., "Kinetic Effects in Coercivity Measurements", IEEE Transactions on Magnetics, vol. Mag-17, No. 6:3020-3022 (1981).
Slonczewski, et al., "Current-driven excitation of Magnetic multilayers", *Journal of Magnetism and Magnetic Materials*, vol. 159, pp. L1-L7, 1996.
Thirion, C. et al., "Switching of magnetization by nonlinear resonance studied in single nanoparticles", *Nature Materials*, Nature Publishing Group www.nature.com/naturematerials, vol. 2, 524-527 (Aug. 2003).
Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.
Xi, Haiwen et al., "Spin-current effect on ferromagnetic resonance in patterned magnetic thin film structures", J of Applied Physics 97, 033904-1-033904-5 (2005).
Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

* cited by examiner

PROGRAMMABLE AND REDUNDANT CIRCUITRY BASED ON MAGNETIC TUNNEL JUNCTION (MTJ)

BACKGROUND

This application relates to magnetic materials and structures, and devices based on such materials and structures.

Various magnetic materials use multilayer structures which have at least one ferromagnetic layer configured as a "free" layer whose magnetic direction can be changed by an external magnetic field or a control current. One example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. MTJ can be used in various applications, including sensing devices, memory devices and circuits.

SUMMARY

This application describes, among other features, techniques, apparatus and circuits based on magnetic or magnetoresistive tunnel junctions (MTJs). In one aspect, a programmable circuit includes a magnetic tunnel junction (MTJ); a MTJ control circuit coupled to the MTJ to control the MTJ to cause a breakdown in the MTJ in programming the MTJ, thus forming a breakdown region with a low resistance; and a sensing circuit coupled to the MTJ to sense a voltage under a breakdown condition of the MTJ.

In another aspect, a programmable circuit includes a first magnetic tunnel junction (MTJ) and a second MTJ that are connected to each other in series; a sensing circuit coupled to a sensing location in a conductive path between the first MTJ and second MTJ to sense a voltage at the sensing node; a first MTJ control circuit coupled to the first MTJ to control the first MTJ; and a second MTJ control circuit coupled to the second MTJ to control the second MTJ. One of the first and second MTJ control circuits operates to supply a high voltage to break down a respective MTJ to increase a sensing margin at the sensing location.

In another aspect, a programmable circuit includes a magnetic tunnel junction (MTJ); a circuit element that has a structure different from the MTJ and connected to the MTJ in series; a sensing circuit coupled to a sensing location in a conductive path between the MTJ and the circuit element to sense a voltage at the sensing node; a MTJ control circuit coupled to the MTJ to supply a high voltage to break down the MTJ to increase a sensing margin at the sensing location; and a circuit control circuit coupled to the circuit element to control the circuit element.

In yet another aspect, a method for providing a programmable circuit includes connecting a magnetic tunnel junction (MTJ) in a programmable circuit to supply a high resistance or a low resistance to the programmable circuit; and controlling a current injected into the MTJ to cause a breakdown in the MTJ in programming the programmable circuit to form a breakdown region with a low resistance. In one implementation, this method may also include connecting a second MTJ to the MTJ in series in the programmable circuit; controlling a current injected into the second MTJ to avoid a breakdown in the second MTJ in programming the programmable circuit to make the second MTJ exhibit a high resistance; and sensing a voltage at a sensing location in a conductive path between the MTJ and the second MTJ.

These and other aspects and implementations, their variations and modifications are described in greater detail in the attached drawings, the detailed description, and the claims.

DETAILED DESCRIPTION

A magnetic tunnel junction (MTJ) can be implemented to use an insulator for the middle barrier layer between the two ferromagnetic layers. When the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer. Notably, the resistance to the electrical current across the MTJ structure varies with the relative direction of the magnetizations in the two ferromagnetic layers. When the magnetizations of the two ferromagnetic layers are parallel to each other, the resistance across the MTJ structure is at a low value $R_L$. When the magnetizations of the two ferromagnetic layers are anti-parallel with each other, the resistance across the MTJ is at a high value $R_H$. The magnitude of this effect is commonly characterized by the tunneling magnetoresistance (TMR) defined as $(R_H-R_L)/R_L$. The ratio between the two values, $R_H/R_L$, can be, for example, up to 2 or 3 in some MTJ devices.

The relationship between the resistance to the current flowing across the MTJ and the relative magnetic direction between the two ferromagnetic layers in the TMR effect may be used for nonvolatile magnetic memory devices to store information in the magnetic state of the MTJ. Magnetic random access memory (MRAM) devices based on the TMR effect, for example, may be an alternative to electronic RAM devices. In such MRAM devices, one ferromagnetic layer is configured to have a fixed magnetic direction and the other ferromagnetic layer is a "free" layer whose magnetic direction can be changed to be either parallel or opposite to the fixed direction. Information is stored based on the relative magnetic direction of the two ferromagnetic layers on two sides of the barrier of the MTJ. For example, binary bits "1" and "0" may be recorded as the parallel and anti-parallel orientations of the two ferromagnetic layers in the MTJ. Recording or writing a bit in the MTJ can be achieved by switching the magnetization direction of the free layer, e.g., by a writing magnetic field generated by supplying currents to write lines disposed in a cross stripe shape, by a current flowing across the MTJ based on the spin-transfer torque effect, or by other means. In the spin-transfer switching, the current required for changing the magnetization of the free layer can be small (e.g., 0.1 mA or lower) and can be significantly less than the current used for the field switching. Therefore, the spin-transfer switching in a MTJ can be used to significantly reduce the power consumption of the cell.

Figure 1:
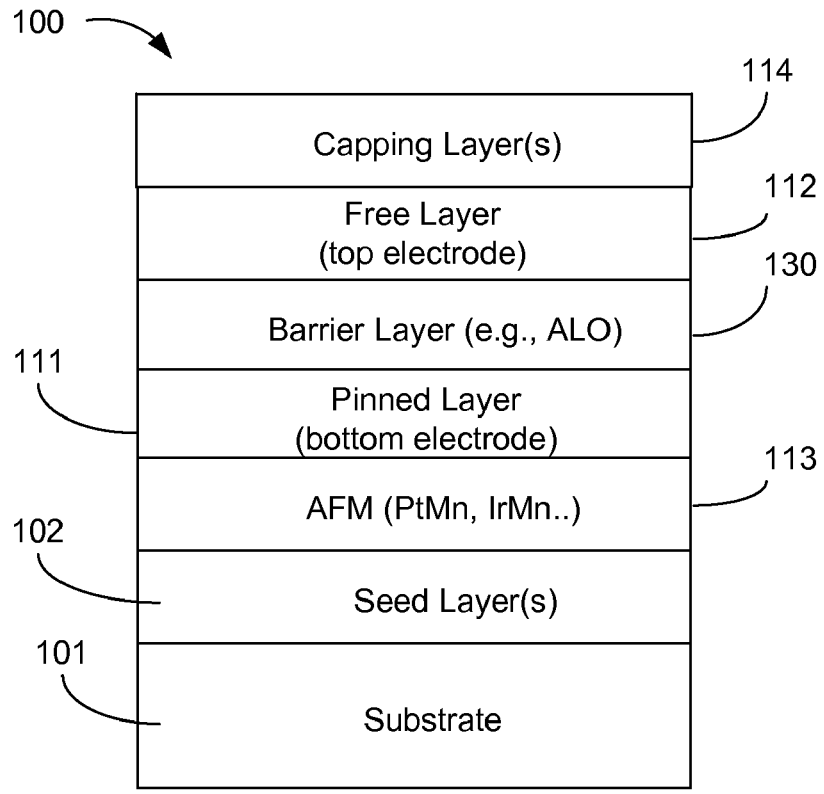
FIG. 1 illustrates one example of a MTJ cell structure.

FIG. 1 illustrates an example of a MTJ 100 formed on a substrate 101 such as a Si substrate. The MTJ 100 is constructed on one or more seed layers 102 directly formed on the substrate 101. On the seed layers 102, an antiferromagnetic (AFM) layer 113 is first formed and then a first ferromagnetic layer 111 is formed on top of the AFM layer 113. After the post annealing, the ferromagnetic layer 111 later is pinned with a fixed magnetization. In some implementations, this fixed magnetization may be parallel to the substrate 101 (i.e., the substrate surface). On top of the first ferromagnetic layer 111 is a thin insulator barrier layer 130 such as a metal oxide layer. In the MTJ 100, a second ferromagnetic layer 112 is formed directly on top of the barrier layer 130. In addition, at least one capping layer 114 is formed on top of the second ferromagnetic layer 112 to protect the MTJ.

The magnetization of the ferromagnetic layer 112 is not pinned and can be freely changed to be parallel to or antiparallel to the fixed magnetization of the pinned layer 111 under a control of either an external control magnetic field or a driving current perpendicularly flowing through the MTJ. For this reason, the layer 112 is a free layer (FL). A magnetic field in the field operating range, or an applied current across the junction in the current operating range, can force the magnetization of the free layer 112 to be substantially parallel to or substantially antiparallel to the fixed magnetization of the pinned layer 111. Many magnetic systems have competing energy contributions that prevent a perfect parallel or antiparallel alignment of the magnetic domains or nanomagnets in each ferromagnetic layer. In MTJs, the dominant contribution to the energy state of the nanomagnets within the free layer 112 tends to force the nanomagnets into the parallel or antiparallel alignment, thus producing a substantial parallel or antiparallel alignment.

A MTJ also exhibits a breakdown effect when the electrical voltage applied across the MTJ junction exceeds a breakdown voltage that breaks down the insulator material for the barrier layer 130. After the occurrence of the breakdown, the MTJ exhibits a low resistance $R_{bk}$ across the barrier layer 130 that is less than $R_L$ and, like $R_H$ and $R_L$, can vary with material compositions and structures of the MTJ. The ratio between $R_{bk}$ and $R_H$, $R_H/R_{bk}$, is much larger than the ratio of $R_H/R_L$. As an example, some MTJs can have the following resistance values: $R_L$=2 Kohm to 5 Kohm, $R_H$=4 Kohm to 15K ohm, and $R_{bk}$=50 ohm to 200 ohm, where the worst case ratio between $R_H$ and $R_{bk}$ is $R_H/R_{bk}$=20 ($R_H$=4 Kohm and $R_{bk}$=200 ohm).

The breakdown property of the MTJ allows the MTJ to be used as a programmable electrical fuse element for various circuits. Such MTJ programmable fuses can be designed to have large sensing margin between the two logic states "0" and "1" and to provide good data retention. A MTJ can be relatively easy to program by controlling the voltage applied across the MTJ junction to the breakdown voltage.

Figure 2:
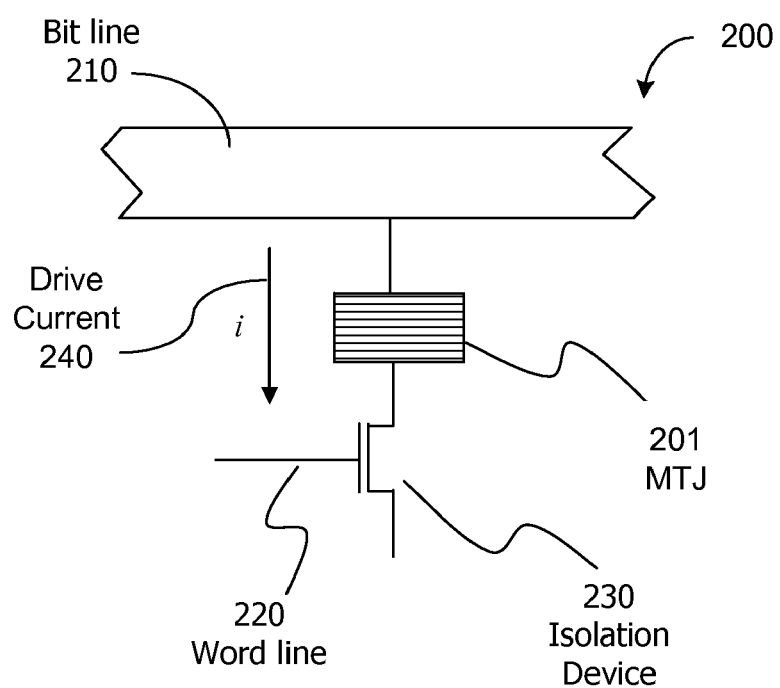
FIG. 2 illustrates a part of a circuit for operating a MTJ cell based on the spin-transfer torque effect.

An MTJ can be structured to operate under a spin-transfer torque effect where a spin polarized current is injected into the MTJ to flow in a direction perpendicular to the free layer and to control the direction of the magnetization of the free layer. The direction of magnetization can be controlled and switched via spin exchange between the electrons in the driving current and the free layer without requiring an external magnetic field. FIG. 2 depicts another implementation, a device 200 having a magnetic element 201 based on the spin-transfer torque effect having at least one low magnetization free layer. A conductor line 210 labeled as "bit line" is electrically coupled to the magnetic element 201 by connecting to one end of the magnetic element 201 to supply an electrical drive current 240 through the layers of the magnetic element 201 to effectuate the spin-transfer torque effect in the magnetic element 201. An electronic isolation device 230, such as an isolation transistor, is connected to one side of the magnetic element 201 to control the current 240 in response to a control signal applied to the gate of the transistor 230. A second conductor line 220 labeled as "word line" is electrically connected to the gate of the transistor 230 to supply that control signal.

In operation, the drive current 240 flows across the layers in the magnetic element 201 to change magnetization direction of the free layer when the current 240 is greater than a switching threshold which is determined by materials and layer structures of the magnetic element 201. The switching of the free layer in the magnetic element 201 is based on the spin-transfer torque caused by the drive current 240 alone without relying on a magnetic field produced by the lines 210 and 220 or other sources. In various applications, the magnetic cell shown in FIG. 2 is implemented as a unit cell of a magnetic array.

Figure 3:
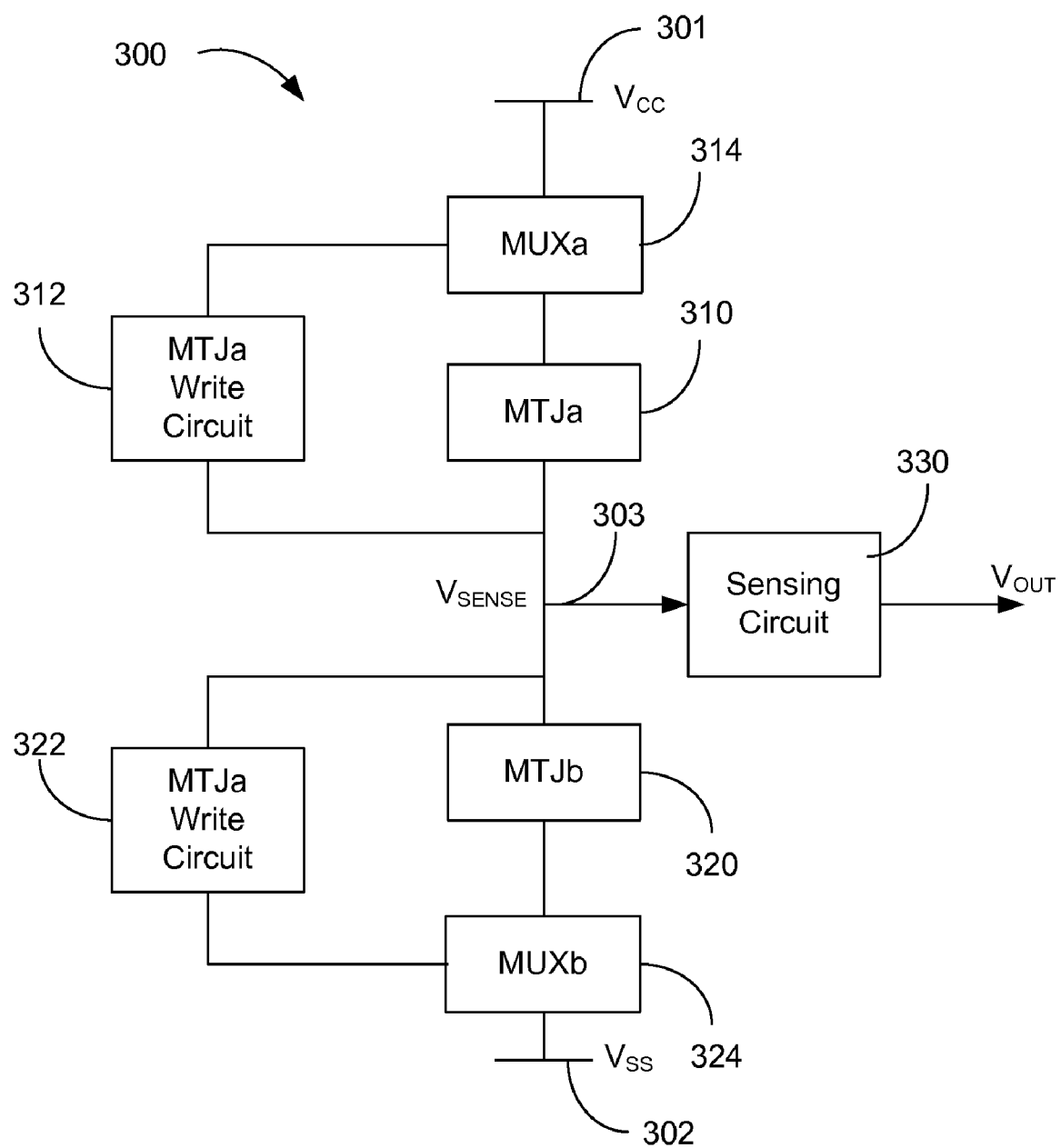
FIG. 3 illustrates a programmable circuit with two cascaded MTJ cells.

FIG. 3 shows one example of a programmable circuit 300 based on two programmable MTJs based on spin transfer effect. MTJa 310 and MTJb 320 are connected in series between 301 Vcc and 302 Vss and the magnetization of each MTJ is controlled by the current injected into each MTJ. The MTJa 310 has one terminal connected to the Vcc and another terminal connected to one terminal of the MTJb 320 while the other terminal of the MTJb 320 is connected to the Vss. A sensing circuit 330 is connected to a sensing location 303 in the conductive path between the MTJa 310 and MTJb 320 to measure the voltage Vsense at the location 303 to produce an output Vout.

A write circuit 312 is coupled to the MTJa 310 to control the electrical bias applied to the MTJa 310 and a separate write circuit 322 is coupled to the MTJb 320 to control the electrical bias applied to the MTJb 320. A circuit multiplexer MUXa 314 is coupled between the Vcc 301 and the MTJa 310 to program the MTJa 310. The MUXa 314 is used to either: (1) connect the MTJa write circuit 312 to the MTJa 310 while isolating and disconnecting the MTJa 310 from the Vcc 301; or (2) connect the MTJa 310 to the Vcc 301 while isolating and disconnecting the MTJa 310 from the write circuit 312.

Similarly, for the write circuit 322, a circuit multiplexer MUXb 324 is coupled between the Vss 302 and the MTJb 320 to program the MTJb 320. The MUXb 324 is used to either (1) connect the MTJb write circuit 322 to the MTJa 320 while isolating and disconnecting the MTJb 320 from the Vss 302; or (2) connect the MTJb 320 to the Vss 302 while isolating and disconnecting the MTJb 320 from the write circuit 322.

In one operation of the above circuit 300, for example, the MTJb 320 can be programmed into the breakdown condition (e.g., $R_{bk}$=200 ohm) and MTJa 310 is set into the high junction resistance $R_H$ to increase the logic "0" sense margin. In order to program MTJb 320 into the breakdown condition, the MUXb circuit 324 is set so that MTJb 320 is connected to MTJb write circuit 322 and is disconnected from Vss 302. Under this connection configuration, a higher than normal write current is provided from the MTJb write circuit 322 to flow through MTJb 320 to cause the MTJb junction 320 to breakdown. After the programming, the MUXb circuit 324 is set so that the MTJb 320 is connected to Vss 302 and disconnected from the MTJb write circuit 322 for normal circuit operation.

In programming the MTJa 310 into the breakdown condition (e.g., Rbk=200 ohm), the MTJb 320 is set into the high junction resistance $R_H$. The MUXa circuit 314 is set so that MTJa 310 is connected to MTJa write circuit 312 and is disconnected from Vcc 301. Under this connection configuration, a higher than normal write current is provided from the MTJa write circuit 312 to flow through MTJa 310 to cause the MTJa junction 310 to breakdown. After the programming, the MUXa circuit 314 is set so that the MTJa 310 is connected to Vcc 301 and disconnected from the MTJa write circuit 312 for normal circuit operation. This condition of MTJa 310 at $R_{bk}$ and the MTJb 320 at $R_H$ to increase the logic "0" sense margin in the circuit 300.

For example, Vsense can be set at 0.95V as the logic "1" state and 0.05V as logic "0" state in the circuit 300 in FIG. 3 with Vcc being set at 1V above Vss. The voltage difference, Delta V=(0.95V−0.05V)=0.9V, which is 90% of Vcc. This larger DeltaV can provide a greater sense margin for the circuit 300.

In comparison, the logic "1" at Vout can be defined as MTJa=RL and MTJb=RH and the logic "0" at Vout can be defined as MTJa=RH and MTJb=RL. With Rratio=$R_H$/$R_L$=3 at Vcc=1.0V, Vsense=0.75V as logic "1" and Vsense=0.25V as logic "0" as an example. The Delta V is (0.75V−0.25V) =0.5V, which is 50% of Vcc. Hence, using the MTJ breakdown characteristics for programming the circuit can improve the sensing margin.

Figure 4:
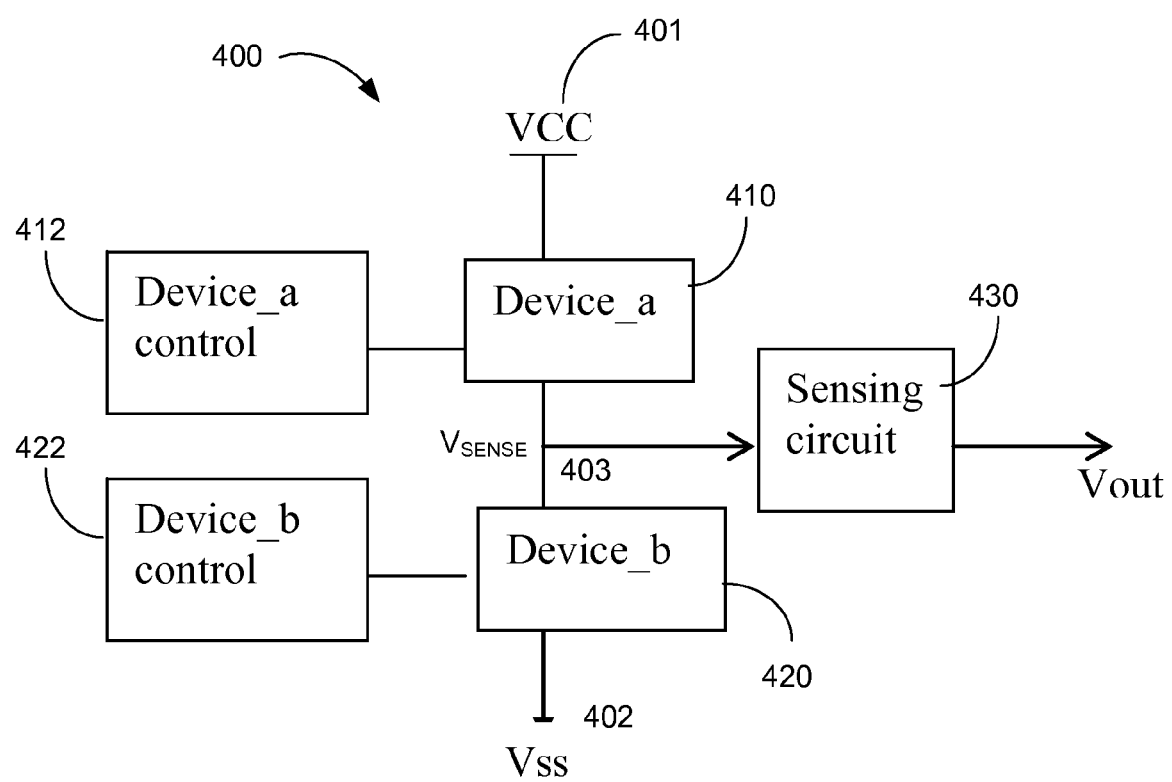
FIGS. 4 and 5 illustrate programmable circuits with one MTJ cell and one non-MTJ circuit element connected in series.

FIG. 4 shows another example of a programmable circuit 400 based on two programmable devices 410 and 420, one of which can be a programmable MTJ while the other can be either a MTJ circuit element or a non-MTJ circuit element such as a MOS transistor or a resistor load. The two devices 410 and 420 are connected in series between 401 Vcc and 402 Vss. The device 410 has one terminal connected to the Vcc and another terminal connected to one terminal of the device 420 while the other terminal of the device 420 is connected to the Vss. A sensing circuit 430 is connected to a sensing location 403 in the conductive path between the devices 410 and 420 to measure the voltage Vsense at the location 403 to produce an output Vout. Two device control circuits 412 and 422 are provided to control the two devices 410 and 420, respectively.

Figure 5:
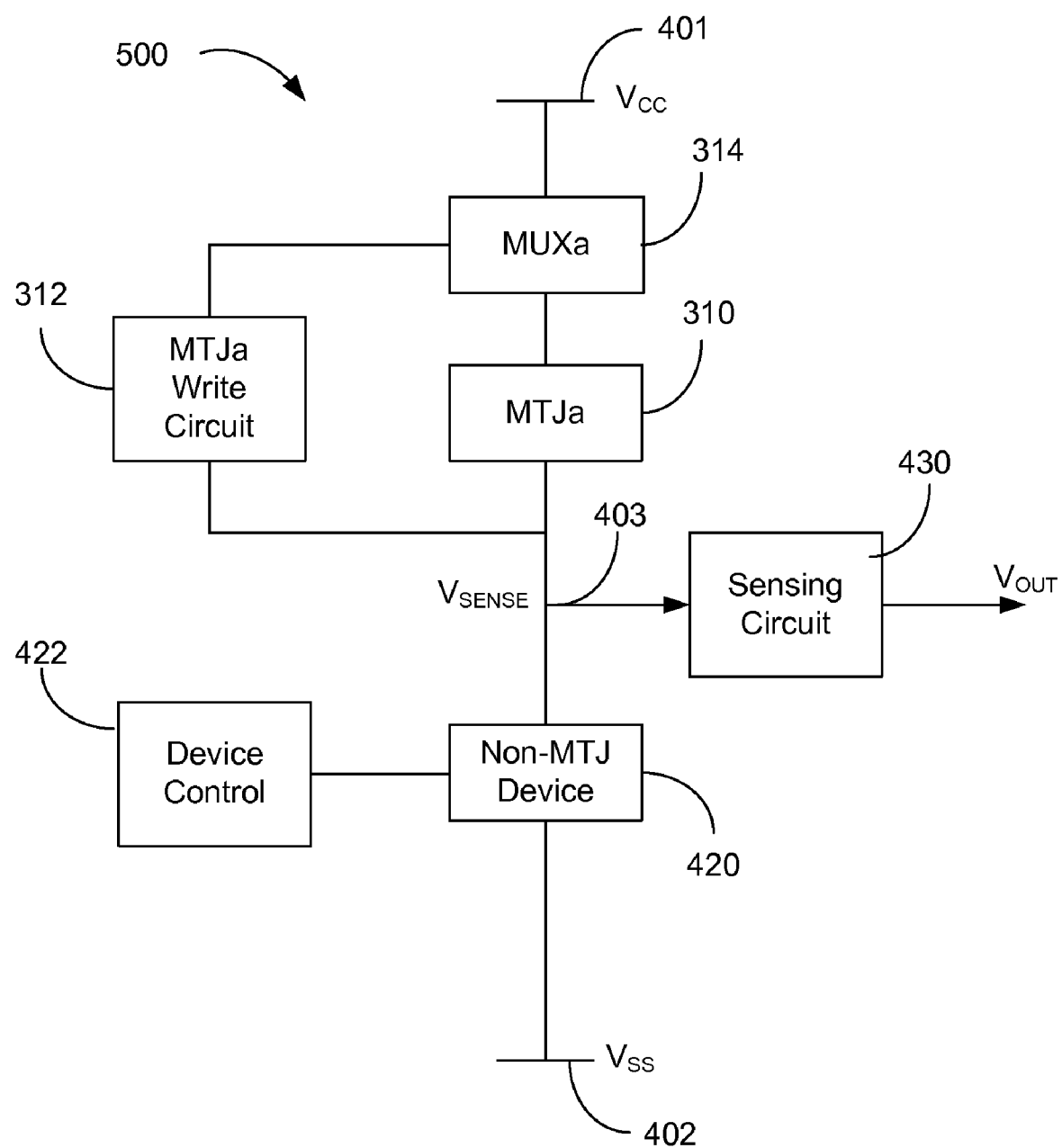

FIG. 5 shows one implementation 500 based on the circuit design in FIG. 4 where the device 410 is implemented as a programmable MTJ 310 as shown in FIG. 3 and the device 420 is a non-MTJ circuit element, such as a MOS transistor or a resistor load element.

Alternatively, another implementation of the circuit design in FIG. 4 can use a resistor load as the device 410 and a programmable MTJ 320 as shown in FIG. 3 as the device 420. In operation, the initial logic "1" is obtained by programming MTJb 420 at its high resistance state $R_H$, the device 410 at its low resistance state $R_L$; for example, the device 410 is at RH=4 kohm, the device 420 is set at RL=2 k (MTJ or MOS transistor/resistor value of 2 kohm), the output at Vout will be "1". If the MTJb 420 is programmed into breakdown state, e.g., MTJb=200 ohm, the ratio between the devices 410 and 420 is 2 kohm/200 ohm=10/1 and Vout will be "0" state because the MTJ 420 is in a breakdown state.

Another application of the device in FIG. 4 is having initial logic "0". i.e., Device_a=MTJa=RH and Device_b=(MTJb or MOS transistor or resistor); for example MTJa=RH=4 kohm, and Device_b=2 kohm, the Vout is "0" initially. And, if ONLY Device_a is programmed into Rbk=200 ohm, the resistor is 200 ohm/2 kohm=1/10 and Vout="1" as results of the breakdown process. Again, ONLY Device_a is used for programming and Device_b is used for resistor load.

While the specification of this application contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Only a few implementations are described. Variations, modifications and enhancements of the described implementations and other implementations can be made based on what is disclosed in this document.

What is claimed is:

1. A programmable circuit, comprising:
   a programmable fuse including;
   a magnetic tunnel junction (MTJ);
   a MTJ control circuit coupled to the MTJ to control the MTJ to cause a breakdown in the MTJ in programming the MTJ, thus forming a breakdown region with a low resistance;
   a sensing circuit coupled to the MTJ to sense a voltage under a breakdown condition of the MTJ; and
   wherein the magnetization of the MTJ is controlled by a current injected into the MTJ based on a spin-transfer torque effect.

2. The programmable circuit as in claim 1 wherein the programmable fuse includes;
   a second MTJ that is connected to the MTJ in series, and
   wherein the sensing circuit is coupled to a sensing location in a conductive path between the MTJ and the second MTJ to sense the voltage at the sensing location.

3. The programmable circuit as in claim 1 wherein the programmable fuse includes;
   a second circuit element that is connected to the MTJ in series, and
   wherein the sensing circuit is coupled to a sensing location in a conductive path between the MTJ and the second circuit element to sense the voltage at the sensing location.

4. The programmable circuit as in claim 3, wherein:
   the second circuit element is a MTJ element.

5. The programmable circuit as in claim 3, wherein:
   the second circuit element is a circuit element different from a MTJ element.

6. The programmable circuit as in claim 5, wherein:
   the second circuit element is a transistor.

7. The programmable circuit as in claim 5, wherein:
   the second circuit element is a resistor.

8. A programmable circuit, comprising:
   a programmable fuse including;
   a first magnetic tunnel junction (MTJ) and a second MTJ that are connected to each other in series;
   a sensing circuit coupled to a sensing location in a conductive path between the first MTJ and second MTJ to sense a voltage at the sensing location;
   a first MTJ control circuit coupled to the first MTJ to control the first MTJ; and
   a second MTJ control circuit coupled to the second MTJ to control the second MTJ;
   wherein one of the first and second MTJ control circuits operates to supply a high voltage to break down a respective MTJ to increase a sensing margin at the sensing location; and
   wherein the magnetization of each of the first MTJ and the second MTJ is controlled by a current injected into the MTJ based on a spin-transfer torque effect.

9. A programmable circuit, comprising:
   a programmable fuse including;
   a magnetic tunnel junction (MTJ);

a circuit element that has a structure different from the MTJ and connected to the MTJ in series;

a sensing circuit coupled to a sensing location in a conductive path between the MTJ and the circuit element to sense a voltage at the sensing location;

a MTJ control circuit coupled to the MTJ to supply a high voltage to break down the MTJ to increase a sensing margin at the sensing location;

a circuit control circuit coupled to the circuit element to control the circuit element; and wherein the magnetization of the MTJ is controlled by a current injected into the MTJ based on a spin-transfer torque effect.

10. The programmable circuit as in claim 9, wherein:
the circuit element is a transistor.

11. The programmable circuit as in claim 9, wherein:
the circuit element is a resistor.

12. A method for providing a programmable circuit, comprising:

providing a programmable fuse including;

connecting a magnetic tunnel junction (MTJ) in a programmable fuse to supply a high resistance or a low resistance to the programmable fuse;

controlling a current injected into the MTJ to cause a breakdown in the MTJ in programming the programmable fuse to form a breakdown region with a low resistance; and controlling the magnetization of the MTJ by a current injected into the MTJ based on a spin-transfer torque effect.

13. The method as in claim 12 wherein providing a programmable fuse includes;

connecting a second MTJ to the MTJ in series in the programmable fuse;

controlling a current injected into the second MTJ to avoid a breakdown in the second MTJ in programming the programmable fuse to make the second MTJ exhibit a high resistance; and sensing a voltage at a sensing location in a conductive path between the MTJ and the second MTJ.

14. The method as in claim 12 wherein providing a programmable fuse includes;

connecting a circuit element to the MTJ in series in the programmable fuse, the circuit element being different from a MTJ in structure;

controlling an operating condition of the circuit element in programming the programmable fuse to make the circuit element exhibit a high resistance; and sensing a voltage at a sensing location in a conductive path between the MTJ and the circuit element.

15. The method as in claim 14, wherein:
the circuit element is a transistor.

16. The method as in claim 14, wherein:
the circuit element is a resistor.

* * * * *